(12) United States Patent
Shimomura et al.

(10) Patent No.: US 10,476,495 B2
(45) Date of Patent: Nov. 12, 2019

(54) DRIVE DEVICE (71) Applicant: NISSAN MOTOR CO., LTD., Yokohama-shi, Kanagawa (JP)

(72) Inventors: Taku Shimomura, Kanagawa (JP); Tetsuya Hayashi, Kanagawa (JP); Akinori Okubo, Kanagawa (JP); Yuichi Iwasaki, Kanagawa (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 0 days.

(21) Appl. No.: 16/310,086

(22) PCT Filed: Jun. 17, 2016

(86) PCT No.: PCT/JP2016/068180
§ 371 (c)(1),
(2) Date: Dec. 14, 2018

(87) PCT Pub. No.: WO2017/216974
PCT Pub. Date: Dec. 21, 2017

(65) Prior Publication Data
US 2019/0181854 A1    Jun. 13, 2019

(51) Int. Cl.
*H03K 17/687* (2006.01)
*H03K 17/16* (2006.01)
*H02M 1/08* (2006.01)
*H03K 17/04* (2006.01)
*H02M 1/00* (2006.01)

(52) U.S. Cl.
CPC ............ *H03K 17/162* (2013.01); *H02M 1/08* (2013.01); *H03K 17/04* (2013.01); *H03K 17/16* (2013.01); *H03K 17/687* (2013.01); *H02M 2001/0054* (2013.01)

(58) Field of Classification Search
CPC .............................. H03K 17/16; H03K 17/162
See application file for complete search history.

(56) References Cited

U.S. PATENT DOCUMENTS 6,275,399 B1    8/2001    Miyazaki et al.
7,236,041 B2 *  6/2007    Kim ........................ H02M 1/08
                                                                   327/110

(Continued)

FOREIGN PATENT DOCUMENTS

JP    61-237513 A    10/1986
JP    02-025107 A    1/1990

(Continued)

*Primary Examiner* — Hai L Nguyen
(74) *Attorney, Agent, or Firm* — Foley & Lardner LLP (57) ABSTRACT

A drive device wherein a main switching element is connected to a main current path, an input terminal of the switching element on the higher potential side and an output terminal of the switching element on the lower potential side are electrically connected to a control terminal of the main switching element, a first resistance is connected between an input terminal of the switching element on the lower potential side and a control terminal of the main switching element, a first capacitor is parallelly connected to the first resistance, and a second capacitor is connected between a connection point of the first resistance and a control terminal of the main switching element and a terminal on the higher potential side of the main switching element.

9 Claims, 11 Drawing Sheets

(56) References Cited

U.S. PATENT DOCUMENTS

| | | | |
|---|---|---|---|
| 8,471,622 B2* | 6/2013 | Ishikawa | H03K 17/08128 |
| | | | 327/108 |
| 9,590,619 B2* | 3/2017 | Kittila | H03K 17/0812 |
| 2001/0030880 A1 | 10/2001 | Miyazaki et al. | |
| 2002/0110008 A1 | 8/2002 | Miyazaki et al. | |
| 2008/0012610 A1 | 1/2008 | Aoki et al. | |
| 2010/0102857 A1 | 4/2010 | Aoki et al. | |
| 2010/0265746 A1 | 10/2010 | Ishikawa et al. | |
| 2011/0210766 A1 | 9/2011 | Aoki et al. | |
| 2012/0182051 A1 | 7/2012 | Aoki et al. | |

FOREIGN PATENT DOCUMENTS

| | | |
|---|---|---|
| JP | 2001-217697 A | 8/2001 |
| JP | 2007-215389 A | 8/2007 |
| JP | 2007-288774 A | 11/2007 |
| JP | 2010-252568 A | 11/2010 |
| JP | 2014-079086 A | 5/2014 |

\* cited by examiner

DRIVE DEVICE

TECHNICAL FIELD

The present invention relates to a drive device.

BACKGROUND ART

Conventionally, a following circuit is known as a semiconductor circuit including a power semiconductor element. Among the total current that flows into a drain terminal in a reflux mode, in order to make the main component an FET current, the semiconductor element is designed so as to make the voltage of the power semiconductor element during backward operation lower than a forward voltage of a diode between a gate and drain. Also, in order to prevent the diode between the gate and drain from having based forwardly, a Schottky diode is arranged between the gate and drain of the power semiconductor element (Patent Document 1).

PRIOR ART DOCUMENT

Patent Document

[Patent Document 1] JP 2007-215389 A

SUMMARY OF INVENTION

Problems to be Solved by Invention

However, the above semiconductor circuit has a problem that with its circuit structure, reduction of a switching loss and suppression of the surge voltage cannot be achieved.

A problem to be solved by the present invention is to provide a drive device that enables reduction of the switching loss and suppression of the surge voltage.

Means for Solving Problems

In the present invention, the above problem is solved by connecting the main switching element to a main current path, electrically connecting an input terminal of the switching element on the higher potential side and an input output terminal of the switching element on the lower potential side to a control terminal of the main switching element, connecting a first resistance between the input terminal of the switching element on the lower potential side and the control terminal of the main switching element, parallelly connecting a first capacitor to the first resistance, and connecting a second capacitor between a connection point of the first resistance and the control terminal of the main switching element and a terminal on the higher potential side of the main switching element.

Effect of Invention

In the present invention, surge voltage can be suppressed while reducing a switching loss.

MODES FOR CARRYING OUT THE INVENTION

In the following, embodiments of the present invention are described with reference to the drawings.

First Embodiment

Figure 1:
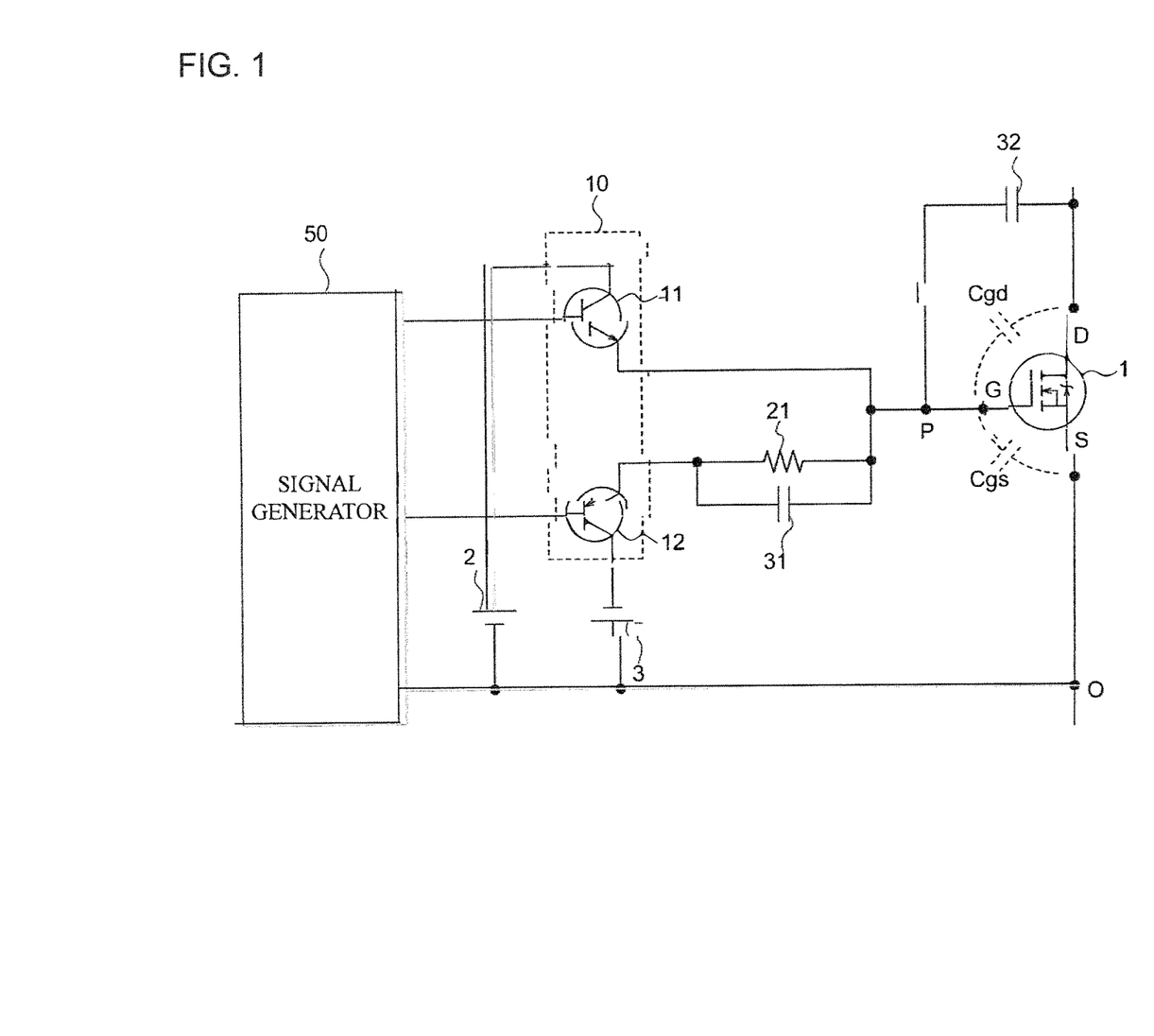
FIG. 1 is a circuit diagram of a drive device according to a present embodiment.

FIG. 1 is a circuit diagram of a drive device according to the present embodiment. The drive device according to the present embodiment is used for a power converter (switching circuit), etc., of an inverter or converter. The drive device switches ON and OFF of a switching element included in a power conversion circuit. The drive device is not limited for use in the power converter, but may be used for other devices provided with the switching element.

The power converter converts direct-current (DC) power output from a battery to alternating-current (AC) power. The power converter includes an inverter circuit in which a plurality of switching elements are connected in a bridge form. The inverter includes a plurality of series circuits in which a plurality of switching elements are serially connected and each series circuit is connected in parallel. For example, in a three-phase inverter circuit, three series circuits are connected in parallel. Then, connection points of the plurality of the switching elements are respectively connected to a three-phase motor by phase.

FIG. 1 illustrates a drive device for driving a switching element of an upper arm circuit for a single phase. More, the drive device according to the present embodiment may be applied to a switching element of a lower arm circuit.

As shown in FIG. 1, the drive device includes a switching element 1, power supplies 2 and 3 for driving, push-pull circuit 10, resistance 21, capacitors 31 and 32, and a signal generator 50.

The switching element 1 is a power semiconductor element for high voltage and high current. The switching element 1 is a transistor (MOSFET) including a control terminal, a terminal on the higher potential side, and a terminal on the lower potential side. For the switching element, a switching element formed by a wide band-gap semiconductor such as Si, or SiC, etc., is used. In the following, explanation is made based on a MOSFET as the switching element 1. A drain terminal (D) of the MOSFET is a terminal on the higher potential side for the switching element 1, a source terminal of the MOSFET is a terminal on the lower potential side of the switching element 1, and a gate terminal of the MOSFET is the control terminal of the switching element 1.

The switching element 1 is connected to a wire between a neutral point of an inverter circuit and a feeding bus in the main current path. The drain terminal of the switching element 1 is connected to the feeding bus and the source terminal of the switching element 1 is connected to a neutral point O. The neutral point O is a connection point between the switching element 1 of the upper arm and the switching element of the lower arm. The main current path is a path from a battery to a three-phase wire via the feeding bus. The three-phase wire connects a connection point of each phase in the inverter circuit and an input-output terminal of a three-phase motor.

A push-pull circuit 10 is a drive circuit for driving a switching element 1 and includes a transistor 11 and a transistor 12. The transistor 11 is a switching element on the higher potential side and is an NPN-type transistor. The transistor 12 is a switching element on the lower potential side and is a PNP-type transistor. For the transistors 11 and 12, for example, an IGBT is used. The transistors 11 and 12 may be a unipolar transistor or a bipolar transistor. The transistors 11 and 12 switch ON and OFF by a switching signal sent from a signal generator.

The transistor 11 and transistor 12 are electrically connected in series while their conductive directions (in a forward direction) of the current are reversed. A collector terminal of the transistor 11 is connected to a positive electrode of a power supply 2. An emitter terminal of the transistor 11 is connected to a gate electrode of the switching element 1. A collector terminal of the transistor 12 is connected to a negative electrode of a power supply 3. An emitter terminal of the transistor 12 is electrically connected to a gate electrode of the switching element 1. The base terminals of the transistors 11 and 12 are connected to a signal generator 50 respectively.

To turn on the switching element 1, the signal generator outputs an ON signal to the transistor 11. The transistor 11 becomes an ON state and the gate current flows to the switching element 1 from the emitter terminal of the transistor 11. In other words, in a turn-on operation of the switching element 1, the emitter terminal of the transistor 11 becomes an output terminal of the current.

Further, to turn off the switching element 1, the signal generator 50 outputs an OFF signal to the transistor 12. The transistor 12 becomes an ON state and the electric charge charged between the gate and source of the switching element 1 is discharged and the gate current flows to the emitter terminal of the transistor 12 from the gate terminal. In other words, in a turn-off operation of the switching element 1, the emitter terminal of the transistor 12 becomes an input terminal of the current.

The power supply 2 is a power supply for driving the transistor 11. The power supply 3 is a power supply for driving the transistor 12. The negative electrode of the power supply 2 and the positive electrode of the power supply 3 are connected to a wire connecting the signal generator 50 and the neutral point O.

The resistance 21 is connected between the emitter terminal of the transistor 12 and the gate terminal of the switching element 1. The resistance 21 is connected for adjusting a gate resistance of the switching element 1.

The capacitor 31 is connected in parallel to the resistance 21. In other words, the parallel circuit of the resistance 21 and capacitor 31 is connected between the emitter terminal of the transistor 12 and the gate terminal of the switching element 1. The capacitor 31 is connected for adjusting the gate resistance of the switching element 1.

The capacitor 32 is connected between a connection point P and the gate terminal of the switching element 1. The connection point P is a connection point of the resistance 21 and the gate terminal of the switching element 1. In other words, the capacitor 32 is connected in parallel to a parasitic capacitance Cgd of the switching element 1. The parasitic capacitance Cgd is a parasitic capacitance between the gate and drain of the switching element 1. The capacitor 32 is connected for adjusting switching speed when turning off the switching element.

Because of the MOSFET structure, the switching element 1 includes a parasitic capacitance Cgs between the gate and source, and includes the parasitic capacitance Cgd between the gate and drain. Also, a capacity ratio ($C_1/C_2$: a capacity ratio of an electrostatic capacitance $C_1$ against an electrostatic capacitance $C_2$) between an electrostatic capacitance ($C_1$) of the capacitor 31 and an electrostatic capacitance ($C_2$) of the capacitor 32 is greater than a capacity ratio (Cgs/Cgd) of the parasitic capacitance. In other words, the electrostatic capacitance of the capacitors 31 and 32 and parasitic capacitances Cgs and Cgd of the switching element 1 are set so as to satisfy the following formula (1).

[Formula 1]

$$\frac{C_1}{C_2} > \frac{C_a}{C_b} \quad (1)$$

The signal generator 50 outputs a switching signal to the base terminal of the transistor 11 and the base terminal of the transistor 12. The signal generator 50 is connected to the base terminal of the transistor 11, the base terminal of the transistor 12, and the neutral point O.

Figure 2A:
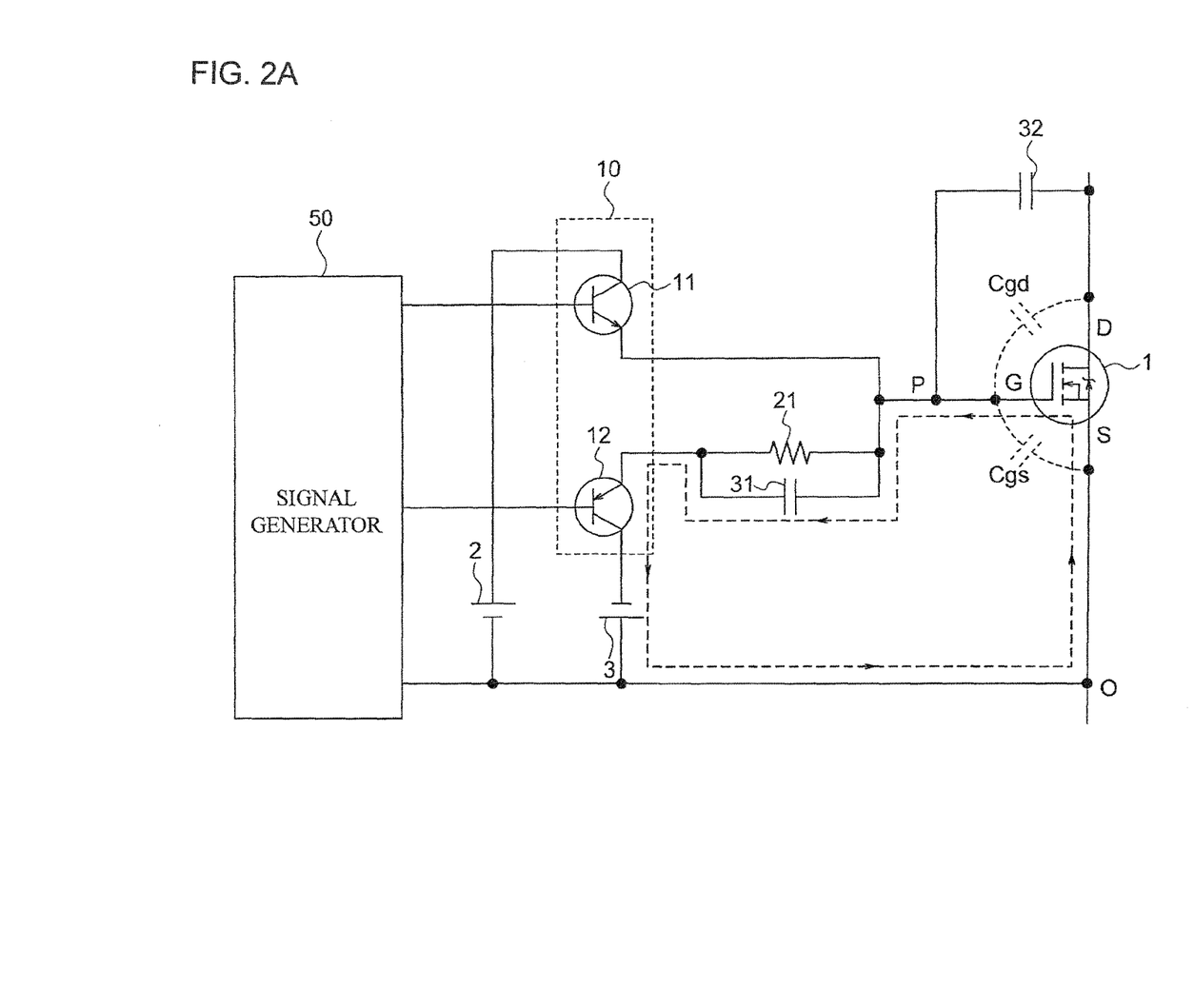
FIG. 2A is a diagram of FIG. 1 except that a current conduction path in a first step is added.
Figure 2B:
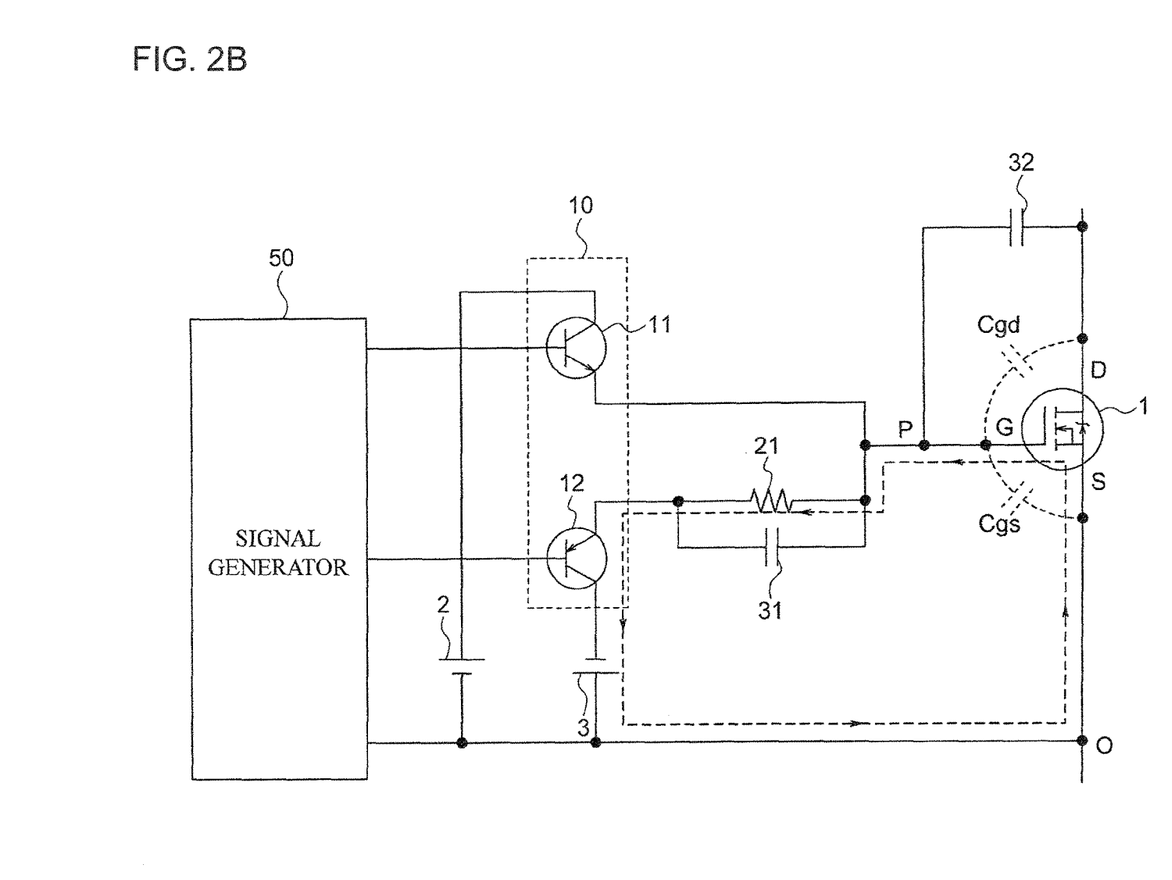
FIG. 2B is a diagram of FIG. 1 except that a current conduction path in a second step is added.
Figure 2C:
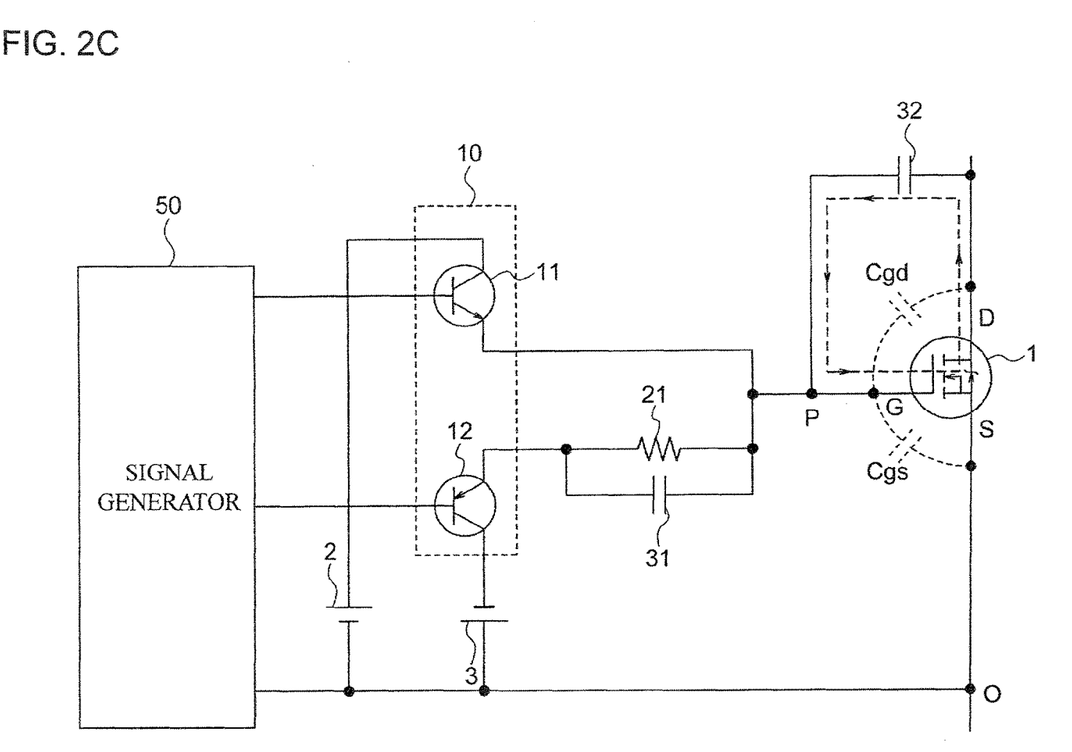
FIG. 2C is a diagram of FIG. 1 except that a current conduction path in a third step is added.

Next, using FIG. 2A to FIG. 2C, circuit operation during turn off of the switching element 1 is explained. FIG. 2A to FIG. 2C are diagrams similar to FIG. 1 except that a conduction path of the current is added. The conduction path of the current is illustrated in a dotted line. More, FIG. 2A to FIG. 2C illustrate a flow of the current when the switching element 1 turns off in chronological order. As explained in the following, the circuit operation of the drive device during turn-off can be divided into three steps. FIG. 2A illustrates a current path in the first step, FIG. 2B illustrates a current path in the second step, and FIG. 2C illustrates a current path in the third step.

While the switching element 1 is in the ON state, the signal generator 50 outputs an OFF signal to the transistor 11 and outputs an ON signal to the transistor 12. The transistor 11 becomes an OFF state and the transistor 12 becomes an ON state. When the transistor 12 becomes an ON state, the path between the gate terminal of the switching element 1 and the collector terminal of the transistor 12 becomes a conducted state. Then, the electric charge charged to the parasitic capacitance Cgs of the switching element 1 is discharged.

Between the gate terminal of the switching element 1 and the emitter terminal of the transistor 12, a parallel circuit of the resistance 21 and capacitor 31 is connected. An impedance of the capacitor 31 is smaller than an impedance of the resistance 21. For this reason, the electric charge charged to the parasitic capacitance Cgs is extracted through a path from the gate terminal of the switching element 1, the capacitor 31, and the emitter terminal of the transistor 12.

Thus, the gate current at the start of the turn-off flows through the path as shown in FIG. 2A. In other words, the gate current right after the start of turn-off (first step) flows through the capacitor 31 that has a low impedance. In this way, the electric charge of the switching element 1 can be discharged at high speed. As a result, switching loss can be reduced while raising the switching speed.

As to the electric charge charged to the parasitic capacitance Cgs, when the electric charge that corresponds to the electrostatic capacitance of the capacitor 31 is discharged, the impedance of the capacitor 31 becomes higher than the impedance of the resistance 21. That is to say, in the second step following the first step, the path for the gate current switches to the path from the gate terminal of the switching element 1 to the emitter terminal of the transistor 12 (see FIG. 2B) through the resistance 21. The electric charge charged to the parasitic capacitance Cgs is discharged at low speed by the path that goes through the resistance 21. In this way, surge voltage can be suppressed while suppressing excess increase in the switching speed.

To the drain terminal and source terminal of the switching element 1, a wire that becomes the main current path is connected respectively, and the wire includes the parasitic inductance. For this reason, surge voltage is generated between the drain and source when turning off the switching element 1. Also, when the switching speed becomes high by lowering impedance between the gate terminal of the switching element 1 and the emitter terminal of the transistor 12, the surge voltage becomes even higher.

As the surge voltage between the drain and source changes, the capacitor 32 supplies positive electric charge to the gate terminal of the switching element 1. In other words, in the third step following the second step, a current path is formed between the gate and drain of the switching element 1 as shown in FIG. 2C, and the electric charge of the capacitor 32 is supplied to the gate terminal of the switching element. At the same time, when the variation amount of the surge voltage between the drain and source is positive, positive electric charge is supplied to the gate of the switching element 1 from the capacitor 32. In this way, depending on the variation amount of the surge voltage, switching speed can be suppressed. Consequently, the surge voltage can be suppressed.

In the third step, when the electric charge of the capacitor 32 is supplied to the gate terminal of the switching element, the gate voltage of the switching element 1 becomes high and thus the switching element 1 may be unwantedly turned on by mistake (a self turn phenomenon may occur).

In the present embodiment, in order to prevent the self turn phenomenon of the switching element 1, the relationship between the electrostatic capacitance of the capacitor 31 and the electrostatic capacitance of the capacitor 32 to the parasitic capacitances (Cgs and Cgd) of the switching element 1, is set so as to satisfy the above formula (1). The electrostatic capacitance between gate and drain of the switching element 1 is a combined capacity when the capacitor 32 and parasitic capacitance Cgd are parallelly connected. Also, the electrostatic capacitance between the gate and source becomes the combined capacity when the capacitor 31 and parasitic capacitance Cgs are parallelly connected. Further, by making the capacity of each capacitor satisfy conditions of the formula (1), voltage between the gate and source can be reduced when the voltage between the drain and source is changed.

In this way, the self turn phenomenon of the switching element 1 can be prevented.

As can be seen from the above, in the drive device according to the present embodiment, the switching element 1 is connected to the main current path, and the emitter terminal of the transistor 11 and the emitter terminal of the transistor 12 are electrically connected to the gate terminal of the switching element 1. As to the drive device, the resistance 21 is connected between the emitter terminal of the transistor 12 and the gate terminal of the switching element 1, the capacitor 31 is parallelly connected to the resistance 21, and the capacitor 32 is connected between the connection point P of the resistance 21 and gate terminal and the drain terminal of the switching element 1. In this way, the surge voltage can be suppressed while reducing the switching loss.

In other words, by parallelly connecting the capacitor 31 to the resistance 21, the gate resistance during the turn-off can be suppressed and thus switching speed can be raised. On the other hand, the resistance 21 is connected between the gate terminal of the switching element and the emitter terminal of the transistor 12 to prevent the switching speed from raising because the surge voltage also increases. In this way, the switching speed can be suppressed in the second step. More, increase of the switching speed in the first step may generate surge voltage between the drain and source. In the present embodiment, the capacitor 32 is connected between the connection point P and drain terminal. Accordingly, when the surge voltage between the drain and source changes, the capacitor 32 supplies electric charge to the gate, and thus the switching speed can be suppressed. In this way, during turn-off operation of the switching element 1, by raising the switching speed in the first step, the surge voltage due to an increase in the switching speed in the circuit operation of the second step and the circuit operation of the third step is suppressed in the present embodiment. As a result, reduction of the switching loss and suppression of the surge voltage can be both achieved.

Further, in the present embodiment, an electrostatic capacitance ($C_1$) of the capacitor 31, an electrostatic capacitance ($C_2$) of the capacitor 32, a parasitic capacitance (Cgs) of the switching element 1, and a parasitic capacitance (Cgd) of the switching element 1 are set so as to satisfy the formula (1). In this way, a turn-on error of the switching element 1 can be suppressed.

Second Embodiment

Figure 3:
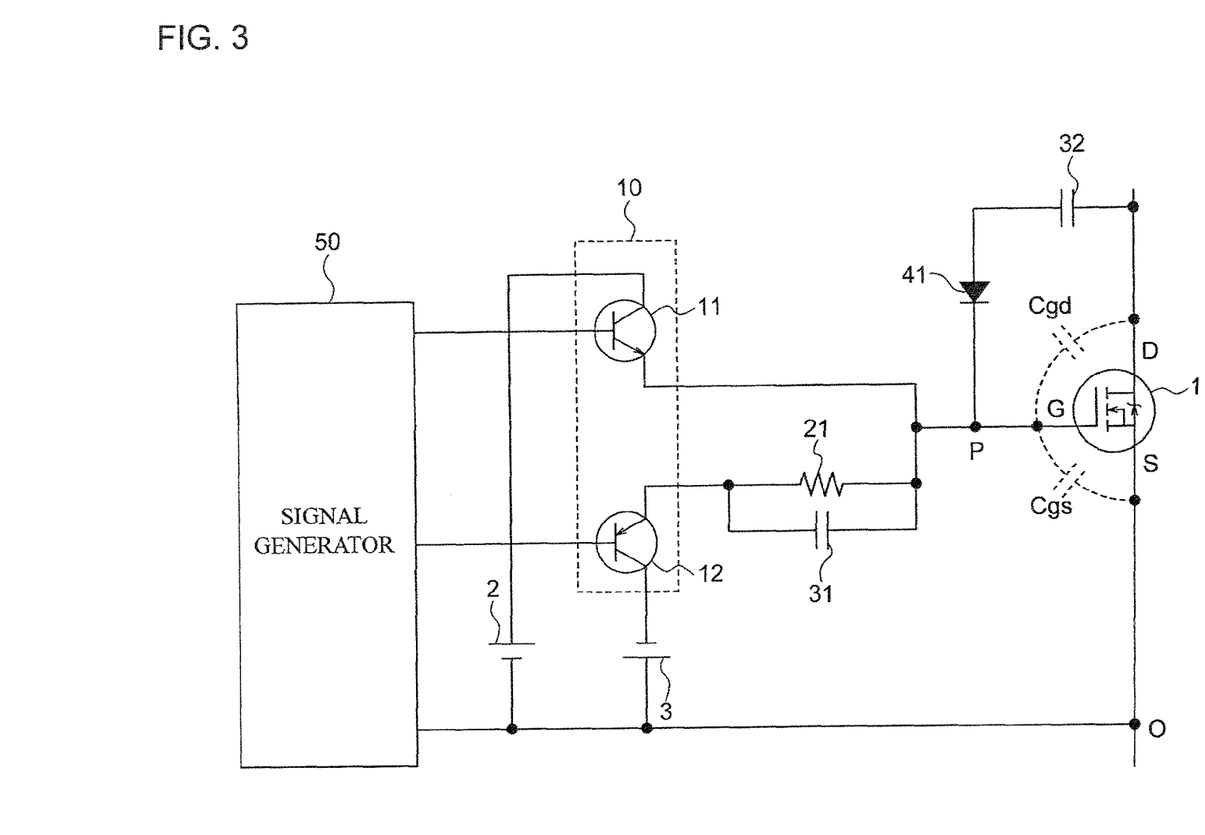
FIG. 3 is a circuit diagram of a drive device according to another embodiment of the present invention.

FIG. 3 is a circuit diagram of a drive device in another embodiment of the present invention. In the present embodiment, a diode 41 is included compared to the first embodiment. Other elements are the same as the first embodiment described above and their descriptions are referenced.

The drive device according to the present embodiment includes a diode 41 in addition to the switching element 1, etc. The diode 41 is connected in series to the capacitor 32 between a connection point P and a drain terminal of the switching element 1. An anode terminal of the diode 41 is connected to a capacitor 32 and a cathode terminal of the diode 41 is connected to the connection point P. In other words, the diode 41 is serially connected to the capacitor 32 so that the forward direction of the diode 41 is a direction which goes from the drain to the gate of the switching element 1.

In a turn-off operation of the switching element 1 due to a change in the surge voltage between the drain and source, the electric charge of the capacitor 32 is supplied to the gate of the switching element 1 in the third step. Since the capacitor 32 and diode 41 are serially connected, positive electric charge is supplied to the gate of the switching element 1 when the voltage variation amount between the drain and source is positive. Whereas, when the voltage variation amount between the drain and source is negative, positive electric charge is not supplied to the gate of the switching element 1. In this way, the surge voltage can be suppressed.

Third Embodiment

Figure 4:
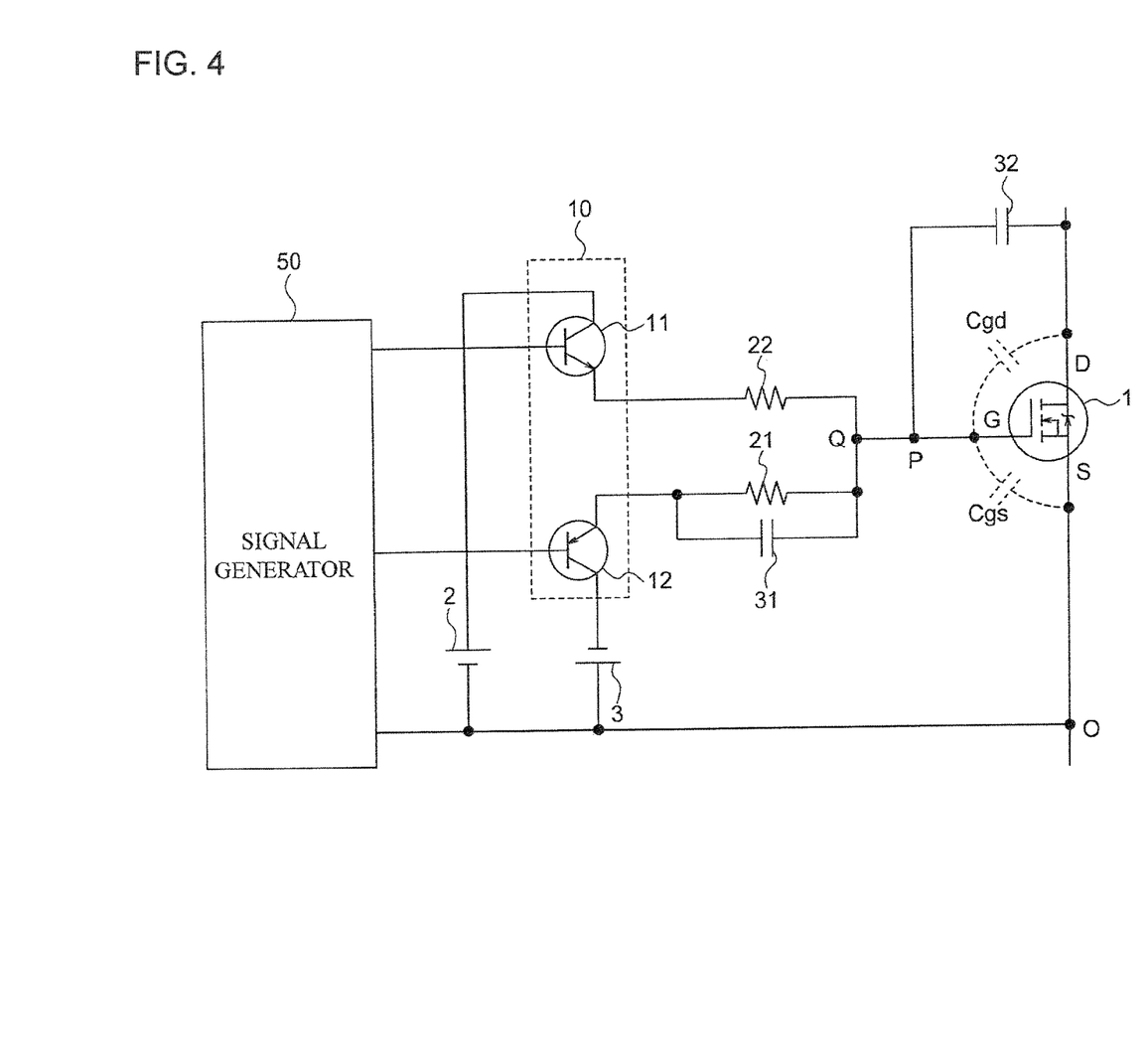
FIG. 4 is a circuit diagram of a drive device according to another embodiment of the present invention.

FIG. 4 is a circuit diagram of the drive device according to another embodiment of the present invention. In the present embodiment, a resistance 22 is included compared to the first embodiment. Other elements are the same as in the first embodiment described above, and the descriptions in the first embodiment and second embodiment are accordingly referenced.

The drive device according to the present embodiment includes a resistance 22 in addition to the switching element 1, etc. The resistance 22 is connected between the emitter terminal of the transistor 11 and the gate terminal of the switching element 1. A connection point Q of the resistance 21 and resistance 22 is connected to the connection point P. The connection point Q is a branch point for branching a control for sending a gate signal from a push-pull circuit 10 to a line for turning on and a line for turning off. The line for the turn-on connects the emitter terminal of the transistor 11 and the gate terminal of the switching element 1. The line for the turn-off connects the emitter terminal of the transistor 12 and the gate terminal of the switching element 1. More, the resistance 22 is connected to the line for the turn-on and a parallel circuit of the resistance 21 and capacitor 31 is connected to the line for the turn-off.

As described above, in the present embodiment, the resistance 22 works as a gate resistance when the switching element 1 turns on, and by setting a resistance value for the resistance 22, switching speed for the turn-on can be adjusted.

The drive device according to the present embodiment may include the diode 41 as in the second embodiment.

Fourth Embodiment

Figure 5:
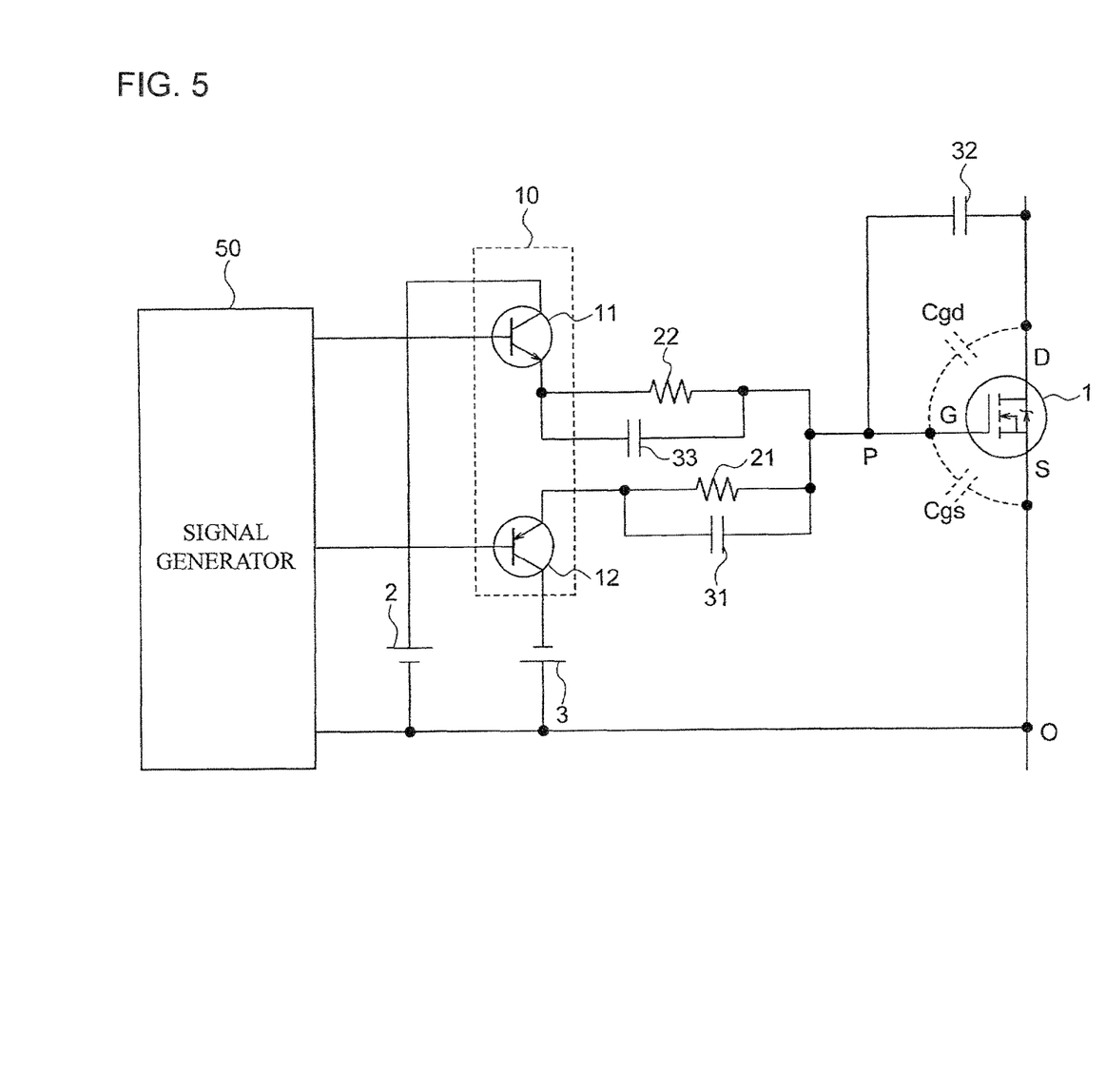
FIG. 5 is a circuit diagram of a drive device according to another embodiment of the present invention.

FIG. 5 is a circuit diagram of a drive device according to another embodiment of the present invention. In the present embodiment, the capacitor 33 is included compared to the third embodiment. Other elements are the same as in the third embodiment described above and the descriptions in the first to third embodiments are accordingly referenced.

The drive device of the present embodiment includes the capacitor 33 in addition to the switching element 1, etc. The capacitor 33 is parallelly connected to the resistance 22.

A circuit operation when turning off the switching element 1 will be described. While the switching element 1 is in the OFF state, the signal generator 50 outputs an ON signal to the transistor 11, and outputs an OFF signal to the transistor 12. By making the transistor 11 to an ON state, the power supply 2 flows gate current to the switching element 1 through the transistor 11.

Between the gate terminal of the switching element 1 and the emitter terminal of the transistor 11, a parallel circuit of the resistance 22 and capacitor 33 is connected. An impedance of the capacitor 33 is smaller than an impedance of the resistance 22. For this reason, when the transistor 11 becomes an ON state, the gate current flows to the gate terminal of the switching element 1 from the emitter terminal of the transistor 11 through the capacitor 33. As a result, the switching speed during the turn-on can be raised. Also, delay of operation during the turn-on of the switching element 1 can be reduced and a dead time can be reduced. Consequently, while securing safety of control, a switching loss can be reduced.

The drive device according to the present embodiment may include a diode 41 as in the second embodiment.

Fifth Embodiment

Figure 6:
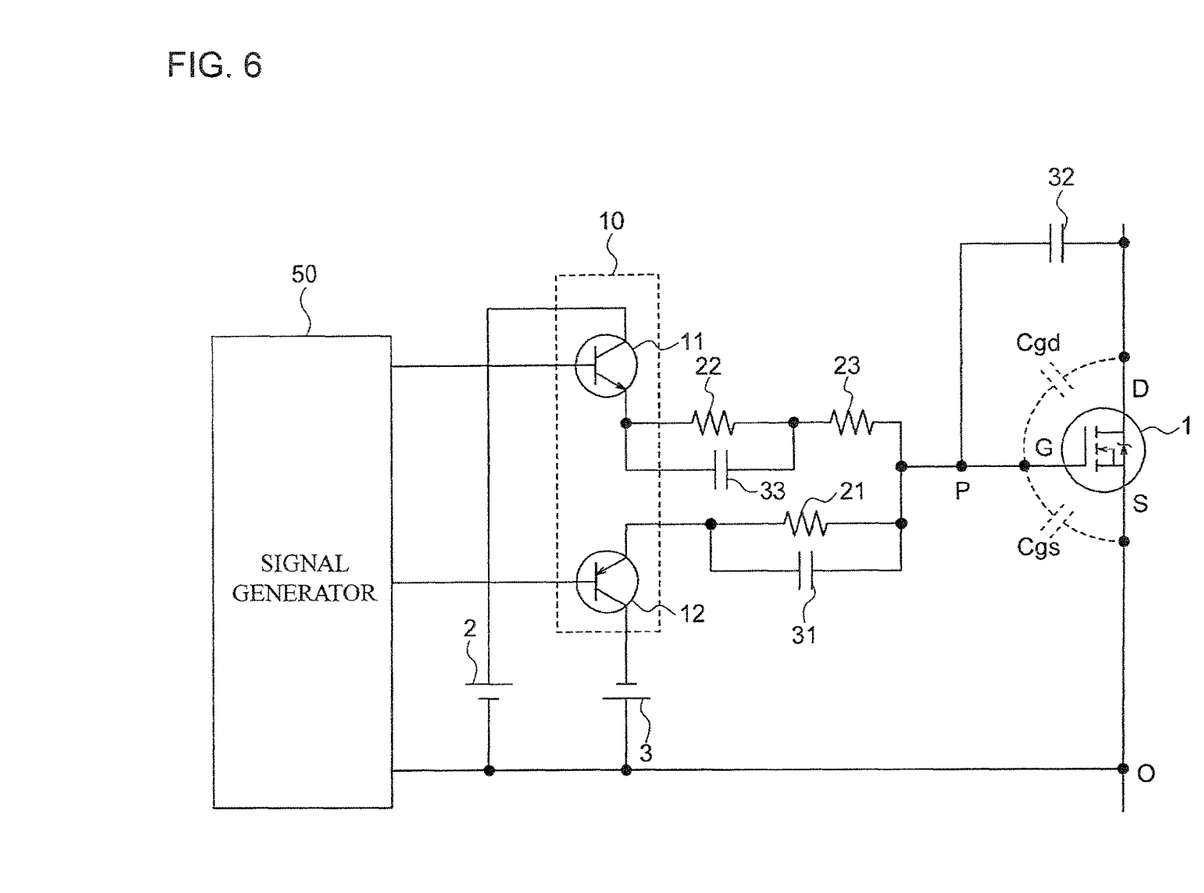
FIG. 6 is a circuit diagram of a drive device according to another embodiment of the present invention.

FIG. 6 is a circuit diagram of the drive device according to another embodiment of the present invention. In the present embodiment, a resistance 23 is included compared to the first embodiment. Other elements are the same as in the first embodiment described above and their descriptions in the first to fourth embodiments are referenced.

The drive device of the present embodiment includes the resistance 23 in addition to the switching element 1. The resistance 23 is serially connected to the capacitor 23. One end of the resistance 23 is connected to a parallel circuit of the resistance 22 and capacitor 33 and the other end of the resistance 23 is connected to the connection point P.

In the present embodiment, an impedance is reduced by connecting a parallel circuit of the resistance 22 and capacitor 33 between the emitter terminal of the transistor 11 and the gate terminal of the switching element 1. Also, by connecting the resistance 33 between the emitter terminal and gate terminal, gate resistance is increased. In other words, connection of the capacitor 33 increases the switching speed of the switching element 1, and connection of the resistance 23 reduces the switching speed.

In this way, in a turn-on operation of the switching element 1, while specifying an initial switching speed with the electrostatic capacitance of the capacitor 33, the initial switching speed can be adjusted by the setting of a resistance value of the resistance 23. As a result, the electromagnetic field noise generated by the turn-on operation of the switching element 1 can be suppressed.

The drive device according to the present embodiment may include a diode 41 as in the second embodiment.

Sixth Embodiment

Figure 7:
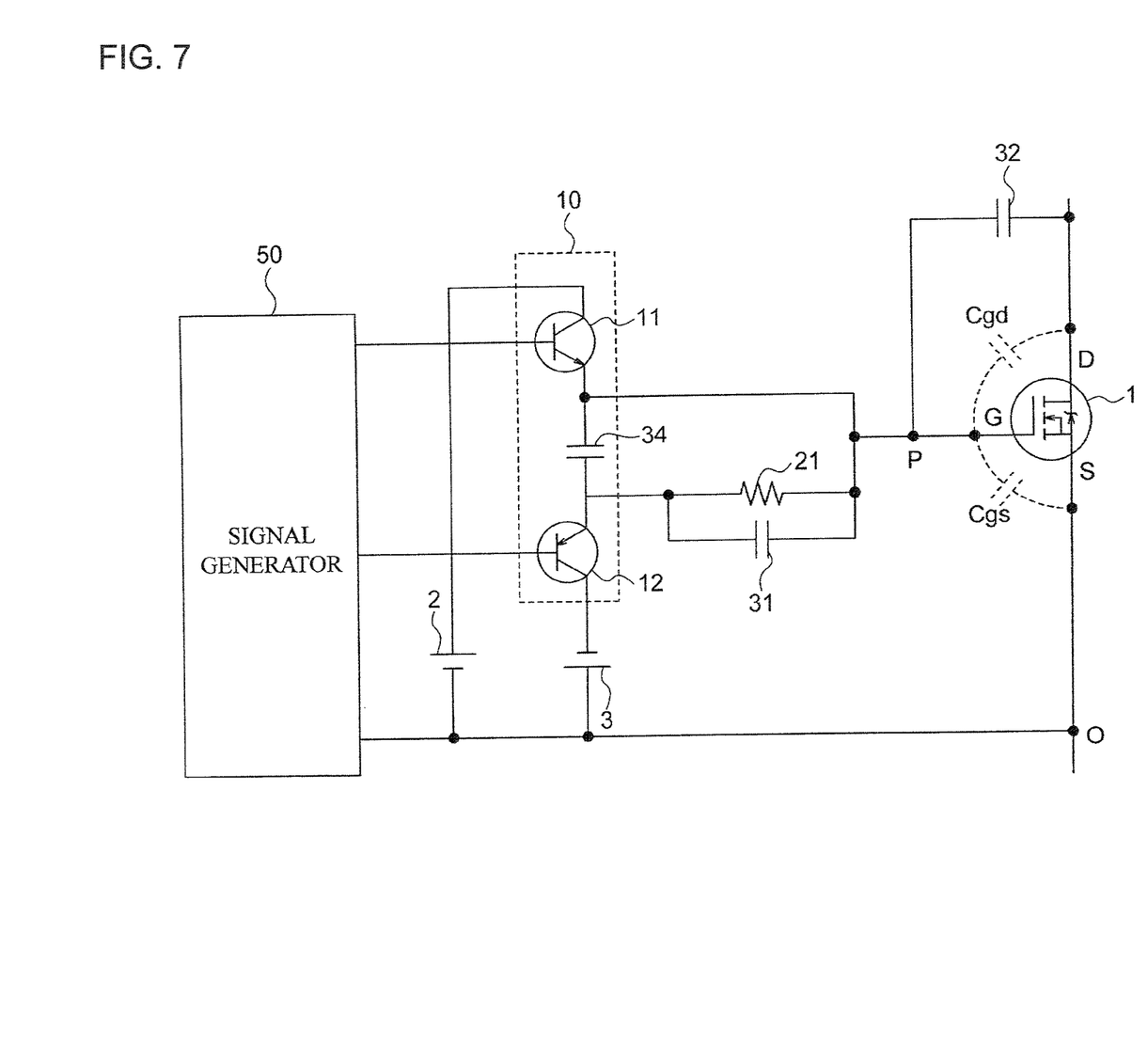
FIG. 7 is a circuit diagram of a drive device according to another embodiment of the present invention.

FIG. 7 is a circuit diagram of the drive device according to another embodiment of the present invention. In the present embodiment, a capacitor 34 is included compared to the first embodiment. Other elements are the same as in the first embodiment described above and their descriptions in the first to fifth embodiments are accordingly referenced.

The drive device according to the present embodiment includes the capacitor 34 in addition to the switching element 1, etc. The capacitor 34 is connected between the emitter terminal of the transistor 11 and the emitter terminal of the transistor 12. One end of the capacitor 34 is connected to the emitter terminal of the transistor 11 and the other end of the capacitor 34 is connected to the emitter terminal of the transistor 12 and the resistance 21. Also, the capacitor 34 constitutes a part of the push-pull circuit 10.

In this way, both an operational delay during turn-on of the switching element 1 and an operational delay during turn-off of the switching element 1 are shortened and a dead time can be reduced. As a result, a switching loss can be reduced while securing safety of the control.

The drive device according to the present embodiment may include a diode 41 as in the second embodiment. Also, the drive device according to the present embodiment may include a resistance 22 as in the third embodiment. More, the drive device according to the present embodiment may include the resistance 22 and capacitor 33 as in the fourth embodiment. Further, the drive device of the present embodiment may include the resistances 22 and 23, and capacitor 33 as in the fifth embodiment.

Seventh Embodiment

Figure 8:
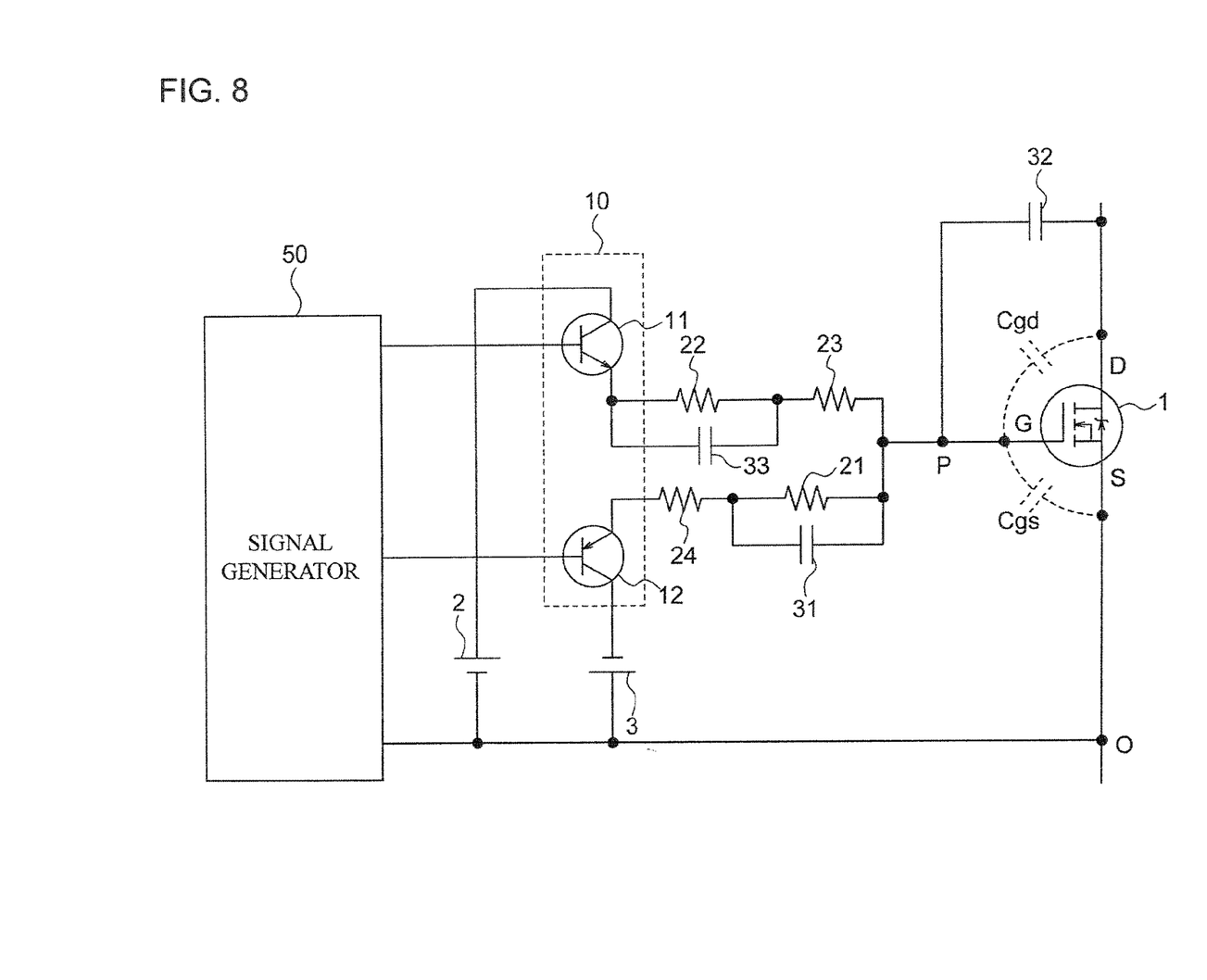
FIG. 8 is a circuit diagram of a drive device according to another embodiment of the present invention.

FIG. 8 is a circuit diagram of the drive device according to another embodiment of the present invention. In the present embodiment, a resistance 24 is included compared to the fifth embodiment. Other elements are the same as in the first embodiment described above and their descriptions in the first to sixth embodiments are referenced.

The drive device according to the present embodiment includes the resistance 24 in addition to the switching element 1, etc. The resistance 24 is connected in series to the capacitor 31. One end of the resistance 24 is connected to a parallel circuit between the resistance 21 and capacitor 31, and the other end of the resistance 24 is connected to the emitter terminal of the transistor 12.

In the present embodiment, a parallel circuit of resistance 21 and capacitor 31 is connected between the emitter terminal of the transistor 12 and the gate terminal of the switching element 1 to reduce impedance. Also, between the emitter terminal and gate terminal, the resistance 24 is connected to raise gate resistance. In other words, connection of the capacitor 31 increases the switching speed of the switching element 1 and connection of the resistance 24 lowers the switching speed.

Consequently, in a turn-off operation of the switching element 1, while specifying the initial switching speed with the electrostatic capacitance of the capacitor 31, the switching speed can be adjusted by setting a resistance value of the resistance 24. As a result, the electromagnetic field noise generated by the turn-off operation of the switching element 1 can be suppressed.

Additionally, the drive device according to the present embodiment may include a diode 41 as in the second embodiment. Also, the drive device according to the present embodiment may include a capacitor 34 as in the sixth embodiment.

Eighth Embodiment

Figure 9:
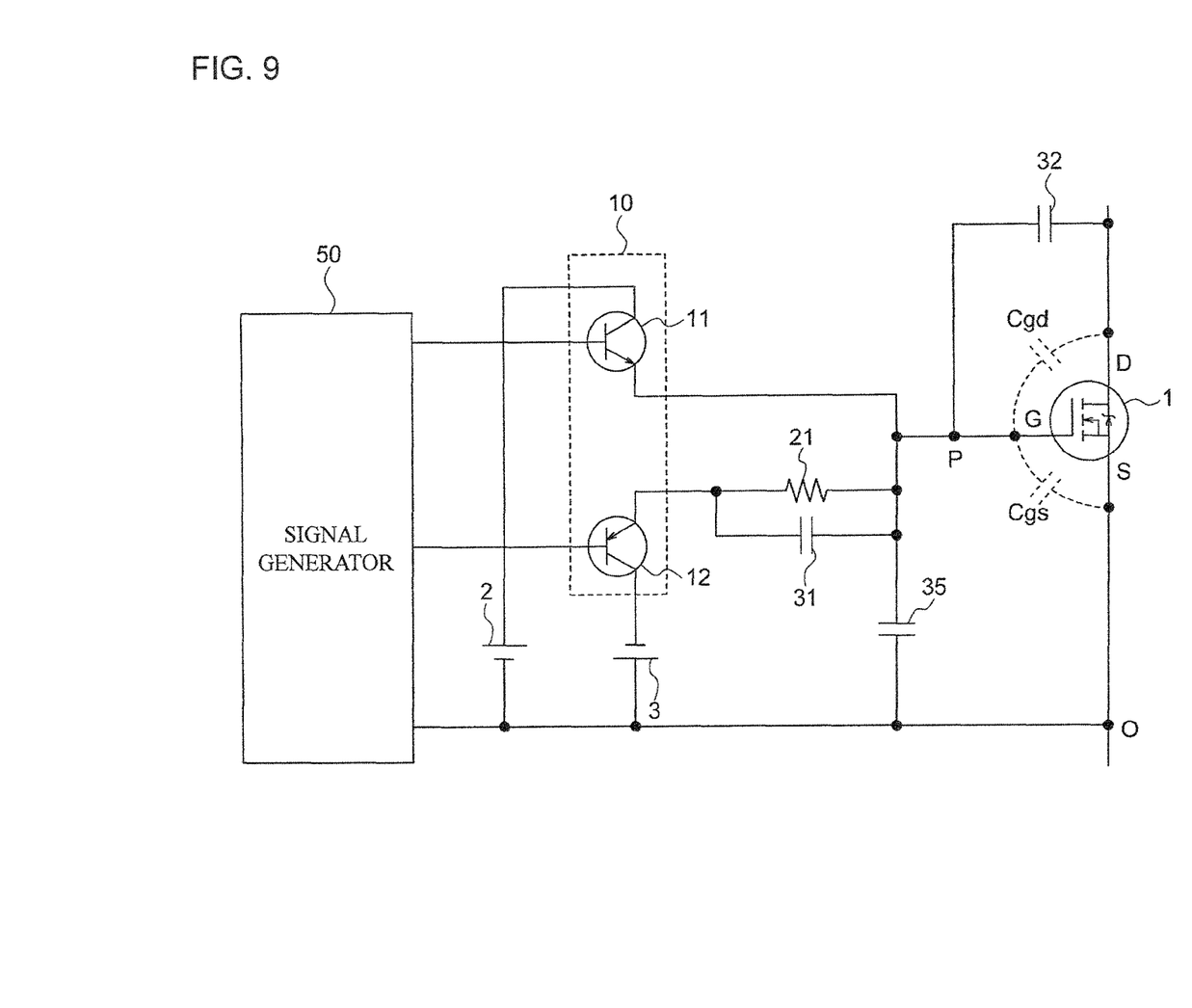
FIG. 9 is a circuit diagram of a drive device according to another embodiment of the present invention.

FIG. 9 is a circuit diagram of the drive device according to another embodiment of the present invention. In the present embodiment, a capacitor 35 is added compared to the first embodiment. Other elements are the same as in the first embodiment described above, and their descriptions in the first to seventh embodiments are referenced.

The drive device according to the present embodiment includes the capacitor 35 in addition to the switching element 1, etc. The capacitor 35 is parallelly connected to the parasitic capacitance Cgs of the switching element 1. One end of the capacitor 35 is connected to a connection point P and the other end of the capacitor 35 is connected to a wire connecting a neutral point O and the positive electrode of the power supply 3.

An electrostatic capacitance between the gate and source of the switching element 1 is the combined capacity when the parasitic capacitance Cgs and capacitor 35 are parallelly connected. When the voltage between the drain and source changes, the gate voltage is determined based on the electrostatic capacitance between the gate and drain of the switching element 1 and the electrostatic capacitance between the gate and source. In the present embodiment, by parallelly connecting the capacitor 35 to the parasitic capacitance Cgs, a capacity ratio that reduces the gate voltage is set. In this way, when the voltage between the drain and source is changed, the voltage between the gate and source can be reduced and a self turn phenomenon of the switching element 1 can be prevented.

Further, the drive device according to the present embodiment may include a diode 41 as in the second embodiment. Also, the drive device according to the present embodiment may include a resistance 22 as in the third embodiment. More, the drive device according to the present embodiment may include the resistance 22 and a capacitor 33 as in the fourth embodiment. Furthermore, the drive device according to the present embodiment may include the resistances 22 and 23, and capacitor 33 as in the fifth embodiment. Additionally, the drive device according to the present embodiment may include a capacitor 34 as in the sixth embodiment. Moreover, the drive device according to the present embodiment may include a resistance 24 as in the seventh embodiment.

Furthermore, a circuit element added in each embodiment may be accordingly arranged in the drive device according to another embodiment.

DESCRIPTION OF REFERENCE NUMERALS

1 Switching element
11 and 12 Transistor
21 to 24 Resistance
31 to 35 Capacitor
41 Diode
50 Signal generator
Cgd Parasitic capacitance
Cgs Parasitic capacitance
O Neutral point
P and Q Connection point

What is claimed is:
1. A drive device comprising:
a main switching element connected to a main current path and including a terminal on the higher potential side, a terminal on the lower potential side, and a control terminal;
a push-pull circuit including a switching element on the higher potential side and a switching element on the lower potential side, for electrically connecting an output terminal of the switching element on the higher potential side and an input terminal of the switching element on the lower potential side to the control terminal;
a first resistance connected between the input terminal of the switching element on the lower potential side and the control terminal;
a first capacitor parallelly connected to the first resistance; and
a second capacitor connected between a connection point of the first resistance and control terminal, and the terminal on the higher potential side,
wherein the drive device satisfies a following formula (1):

$$\frac{C_1}{C_2} > \frac{C_a}{C_b} \qquad (1)$$

$C_1$ denotes an electrostatic capacitance of the first capacitor, $C_2$ denotes an electrostatic capacitance of the second capacitor, $C_a$ denotes a parasitic capacitance of the main switching element between the control terminal and the terminal on the lower potential side, and $C_b$ denotes a parasitic capacitance of the main switching element between the control terminal and the terminal of the higher potential side.

2. The drive device according to claim 1, wherein, in a circuit operation during turn-off of the main switching element, control current that flows from the control terminal to the switching element on the lower potential side flows to the input terminal of the switching element on the lower potential side from the control terminal through the first capacitor, when an impedance of the first capacitor becomes higher than an impedance of the first resistance, a current path of the control current switches from the first capacitor to the first resistance, and after the current path of the control current switches from the first capacitor to the first resistance and the control current flows to the first resistance, an electric charge charged to the second capacitor is supplied to the control terminal.

3. The drive device according to claim 1 comprising a diode serially connected to the second capacitor.

4. The drive device according to claim 1 comprising a second resistance connected between an output terminal of the switching element on the higher potential side and the control terminal.

5. The drive device according to claim 4 comprising a third capacitor parallelly connected to the second resistance.

6. The drive device according to claim 5 comprising a third resistance serially connected to the third capacitor.

7. A drive device comprising:

a main switching element connected to a main current path and including a terminal on the higher potential side, a terminal on the lower potential side, and a control terminal;

a push-pull circuit including a switching element on the higher potential side and a switching element on the lower potential side, for electrically connecting an output terminal of the switching element on the higher potential side and input terminal of the switching element on the lower potential side to the control terminal;

a first resistance connected between the input terminal of the switching element on the lower potential side and the control terminal;

a first capacitor parallelly connected to the first resistance;

a second capacitor connected between a connection point of the first resistance and control terminal, and the terminal on the higher potential side; and a fourth capacitor connected between the output terminal of the switching element on the higher potential side and the input terminal of the switching element on the lower potential side, wherein, one end of the fourth capacitor is connected to the output terminal of the switching element on the higher potential side and the other end of the fourth capacitor is connected to the input terminal of the switching element on the lower potential side.

8. The drive device according to claim 1 comprising a fourth resistance serially connected to the first capacitor.

9. A drive device comprising:

a main switching element connected to a main current path and including a terminal on the higher potential side, a terminal on the lower potential side, and a control terminal;

a push-pull circuit including a switching element on the higher potential side and a switching element on the lower potential side, for electrically connecting an output terminal of the switching element on the higher potential side and input terminal of the switching element on the lower potential side to the control terminal;

a first resistance connected between the input terminal of the switching element on the lower potential side and the control terminal;

a first capacitor parallelly connected to the first resistance;

a second capacitor connected between a connection point of the first resistance and control terminal, and the terminal on the higher potential side; and a fifth capacitor parallelly connected to a parasitic capacitance of the main switching element between the control terminal and the terminal on the lower potential side.

* * * * *